United States Patent
Jin et al.

(10) Patent No.: US 9,876,296 B2
(45) Date of Patent: Jan. 23, 2018

(54) CONNECTOR ASSEMBLY HAVING A RECEPTACLE ON ONE PCB CONNECTED TO A PLUG ON ANOTHER PCB

(71) Applicant: Molex, LLC, Lille, IL (US)

(72) Inventors: Jang Bum Jin, Ansan (KR); Ji Su Shin, Ansan (KR)

(73) Assignee: Molex, LLC, Lisle, IL (US)

( * ) Notice: Subject to any disclaimer, the term of this patent is extended or adjusted under 35 U.S.C. 154(b) by 0 days.

(21) Appl. No.: 15/112,650

(22) PCT Filed: Feb. 19, 2015

(86) PCT No.: PCT/US2015/016608
§ 371 (c)(1),
(2) Date: Jul. 19, 2016

(87) PCT Pub. No.: WO2015/127072
PCT Pub. Date: Aug. 27, 2015

(65) Prior Publication Data
US 2016/0352030 A1 Dec. 1, 2016

(30) Foreign Application Priority Data
Feb. 20, 2014 (KR) .......................... 10-2014-0019793

(51) Int. Cl.
*H01R 12/00* (2006.01)
*H01R 12/73* (2011.01)
(Continued)

(52) U.S. Cl.
CPC ......... *H01R 12/732* (2013.01); *H01R 13/113* (2013.01); *H01R 13/6273* (2013.01); *H05K 1/14* (2013.01); *H01R 2105/00* (2013.01)

(58) Field of Classification Search
CPC ........ H01R 9/096; H01R 12/00; H01R 12/52; H01R 12/732; H01R 13/113; H01R 13/6273; H01R 12/62; H01R 12/716
(Continued)

(56) References Cited

U.S. PATENT DOCUMENTS 4,938,701 A * 7/1990 Heberling ............ H01R 12/732 439/327
5,472,354 A * 12/1995 Chen .................... H01R 12/732 439/357

(Continued)

FOREIGN PATENT DOCUMENTS

| JP | 07-211408 A | 8/1995 |
| JP | 2003-229190 A | 8/2003 |
| JP | 2011-159587 A | 8/2011 |

*Primary Examiner* — Chandrika Prasad
(74) *Attorney, Agent, or Firm* — James A. O'Malley

(57) ABSTRACT

A board-to-board connectory assembly, intended to connect two PCBs using a receptacle connector mounted on a first PCB and a plug connector mounted on a second PCB, is formed with the plug insertion space on the header of the receptacle connector open to the front, and the fastener part inserted removably in the plug insertion space of the header of the plug connector formed on the front part, while each header is mounted in a way so as to pass vertically through the respective PCB, so as to reduce the vertical width of the product. Accordingly, a locking part for locking the fastening part within the plug insertion space is furnished in the fastening part, and the locking part is configured so as to operate elastically in the vertical direction, operating in such a way as to pass through the second PCB.

14 Claims, 6 Drawing Sheets

(51) Int. Cl.
*H01R 13/11* (2006.01)
*H01R 13/627* (2006.01)
*H05K 1/14* (2006.01)
*H01R 105/00* (2006.01)

(58) Field of Classification Search
USPC .......................................... 439/65, 66, 69, 74
See application file for complete search history.

(56) References Cited

U.S. PATENT DOCUMENTS

| | | | | |
|---|---|---|---|---|
| 5,915,975 | A * | 6/1999 | McGrath | H01R 12/7088 439/108 |
| 6,030,248 | A * | 2/2000 | Dancel | H01R 12/7005 439/345 |
| 6,695,642 | B2 | 2/2004 | Shindo et al. | |
| 7,618,283 | B1 * | 11/2009 | Costello | H01R 12/585 439/511 |
| 7,766,666 | B1 * | 8/2010 | Chen | H01R 13/20 439/65 |
| 7,963,796 | B2 * | 6/2011 | Sypolt | H01R 12/58 439/511 |
| 8,162,678 | B2 * | 4/2012 | Wang | H01R 12/724 439/76.1 |
| 8,454,397 | B2 | 6/2013 | Nishi et al. | |
| 9,515,402 | B1 * | 12/2016 | Li | H01R 12/79 |
| 2005/0009379 | A1 * | 1/2005 | Huang | H01R 12/716 439/65 |
| 2012/0170228 | A1 * | 7/2012 | Lai | H01R 12/732 361/740 |
| 2013/0130534 | A1 | 5/2013 | Ohkuma | |

* cited by examiner

CONNECTOR ASSEMBLY HAVING A RECEPTACLE ON ONE PCB CONNECTED TO A PLUG ON ANOTHER PCB

REFERENCE TO RELATED APPLICATIONS

The Present Disclosure claims priority to prior-filed Korean Patent Application No. 10-2014-0019793; entitled "Board to Board Type Connector Assembly," filed on 20 Feb. 2014 with the Korean Patent Office. The content of the aforementioned Patent Application is incorporated in its entirety herein.

BACKGROUND OF THE PRESENT DISCLOSURE

This Present Disclosure relates, generally, to a connector assembly for connecting two printed circuit boards (PCBs), and, more particularly, to a board-to-board connector assembly for connecting two PCBs within a LED TV panel.

When a plurality of PCBs are deployed as in an LED TV, connectors are furnished to connect the PCBs electrically. The PCBs connected to one another are deployed so that the mounting surfaces of the electronic devices mounted thereabove form a single flat surface. Of two PCBs connected together, a female connector will be mounted on one and a male connector will be mounted on the other.

Similarly, a board-to-board connector that connects a board (PCB) to a board (PCB) is disclosed in Korean Unexamined Patent Publication No. 2012-0127510 under the name "connector." The content of the aforementioned Application is hereby incorporated herein in its entirety. The connector according to the '510 Application has the objective of reducing the overall thickness of the circuit board including the connector, but in practice, because it is an on-board type in which the connector is mounted on top of the board, the ability to reduce the overall thickness of the board including the connector is limited.

SUMMARY OF THE PRESENT DISCLOSURE

The object of the Present Disclosure, having been devised in order to resolve the above-described problems, is to provide a board-to-board connector assembly that can realize a low profile and compact size.

The board-to-board connector assembly of the Present Disclosure, intended to connect two PCBs using a receptacle connector mounted on a first PCB and a plug connector mounted on a second PCB, is formed with the plug insertion space on the header of the receptacle connector open to the front, and the fastener part inserted removably in the plug insertion space of the header of the plug connector formed on the front part, while each header is mounted in a way so as to pass vertically through the respective PCB, so as to reduce the vertical width of the product. Accordingly, a locking part for locking the fastening part within the plug insertion space is furnished in the fastening part, and the locking part is configured to operate elastically in the vertical direction, operating in such a way as to pass through the second PCB.

The locking part comprises a push lever that operates elastically in the vertical direction and extends backward, spaced apart from the top surface of the fastening part, and starting from the front end of the top of the fastening part, and a locking projection that fastens removably into the locking groove formed on the receptacle header, projecting forward from the push lever. The push lever is formed as a pair spaced apart to left and right; the push levers are connected together at the back end by a pushing part.

On the inside top surface of the plug insertion space, a lever insertion groove is formed where the lever is inserted while sliding so as to prevent deviation to left or right, so that the fastening part can be fastened securely into the plug insertion space by sliding. The plug insertion space entry of the receptacle head, and the vicinity of the fastening part of the plug header, are respectively furnished with a projecting part and a recessed part, so that when the fastening part is inserted into the plug insertion space during assembly, the projecting part is inserted into the recessed part, in order to reduce the overall front-back thickness of the product and ensure secure coupling of the two headers.

The board-to-board connector assembly further comprises a receptacle contact terminal that has a bending structure, with the lower contact part located within the receptacle header and the upper soldering part being soldered to the top surface of the first PCB, and a plug contact terminal that has a bending structure, with the lower contact part being located within the plug header and the upper soldering part being soldered to the top surface of the second PCB. The board-to-board connector assembly further comprises a receptacle fitting nail that has a bending structure, with the lower part fixed to the receptacle header and the upper soldering part soldered to the top surface of the first PCB; and a plug fitting nail that has a bending structure, with the lower part fixed to the plug header and the upper soldering part soldered to the top surface of the second PCB.

The soldering part of each contact terminal is located behind each header, and the soldering part of each fitting nail is located next to each header. To reduce the front-back thickness of the product, on the rear part of the receptacle header and the rear part of the plug header are respectively formed bending-part insertion grooves into which the upward-bending portions of the components of each contact terminal are inserted. On the plug header, a bending part insertion groove is also furnished on the rear part of the locking part. The receptacle contact terminal and plug contact terminal have a dual contact structure.

The board-to-board connector assembly according to the Present Disclosure has the following effects. First, the receptacle connector and plug connector are mounted through the PCB; the operating space of the push lever, furnished on the plug connector, is formed to pass through the PCB, and because the receptacle contact terminal and plug contact terminal have a dual contact structure, a low profile structure can be realized. Second, a projecting part and recessed part are respectively formed in the vicinity of the plug insertion space entry of the receptacle connector and the fastening part of the plug connector, and these are assembled such that when the fastening part is inserted into the plug insertion space, the projecting part and recessed part are inserted into one another, thus reducing the front-back thickness of the two connectors when assembled, enabling miniaturization of the product. Third, locking is achieved just by inserting the plug connector into the receptacle connector, and the lock is released by the sole action of pressing the push lever of the plug connector, so that the two connectors can readily be coupled and decoupled. Fourth, due to the above properties, when two PCBs are connected within an LED TV panel, the work can be done straightforwardly and the space can be conserved, and the two PCBs can readily be coupled and decoupled.

BRIEF DESCRIPTION OF THE FIGURES

The organization and manner of the structure and operation of the Present Disclosure, together with further objects and advantages thereof, may best be understood by reference to the following Detailed Description, taken in connection with the accompanying Figures, wherein like reference numerals identify like elements, and in which.

DESCRIPTION OF THE PREFERRED EMBODIMENTS

While the Present Disclosure may be susceptible to embodiment in different forms, there is shown in the Figures, and will be described herein in detail, specific embodiments, with the understanding that the Present Disclosure is to be considered an exemplification of the principles of the Present Disclosure, and is not intended to limit the Present Disclosure to that as illustrated.

As such, references to a feature or aspect are intended to describe a feature or aspect of an example of the Present Disclosure, not to imply that every embodiment thereof must have the described feature or aspect. Furthermore, it should be noted that the description illustrates a number of features. While certain features have been combined together to illustrate potential system designs, those features may also be used in other combinations not expressly disclosed. Thus, the depicted combinations are not intended to be limiting, unless otherwise noted.

In the embodiments illustrated in the Figures, representations of directions such as up, down, left, right, front and rear, used for explaining the structure and movement of the various elements of the Present Disclosure, are not absolute, but relative. These representations are appropriate when the elements are in the position shown in the Figures. If the description of the position of the elements changes, however, these representations are to be changed accordingly.

Figure 1:
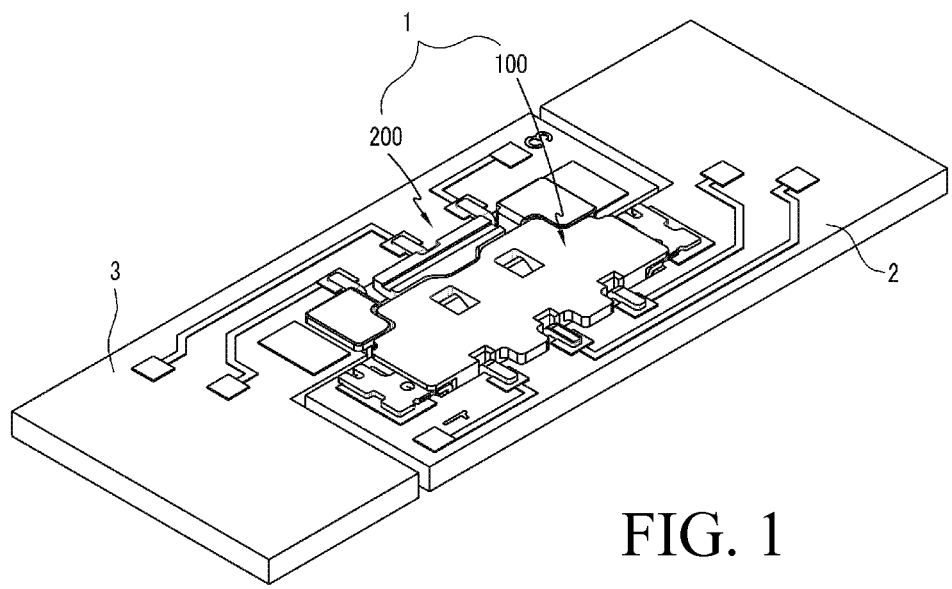
FIG. 1 is a perspective view of two PCBs connected by a board-to-board connector assembly according to the Present Disclosure.
Figure 2:
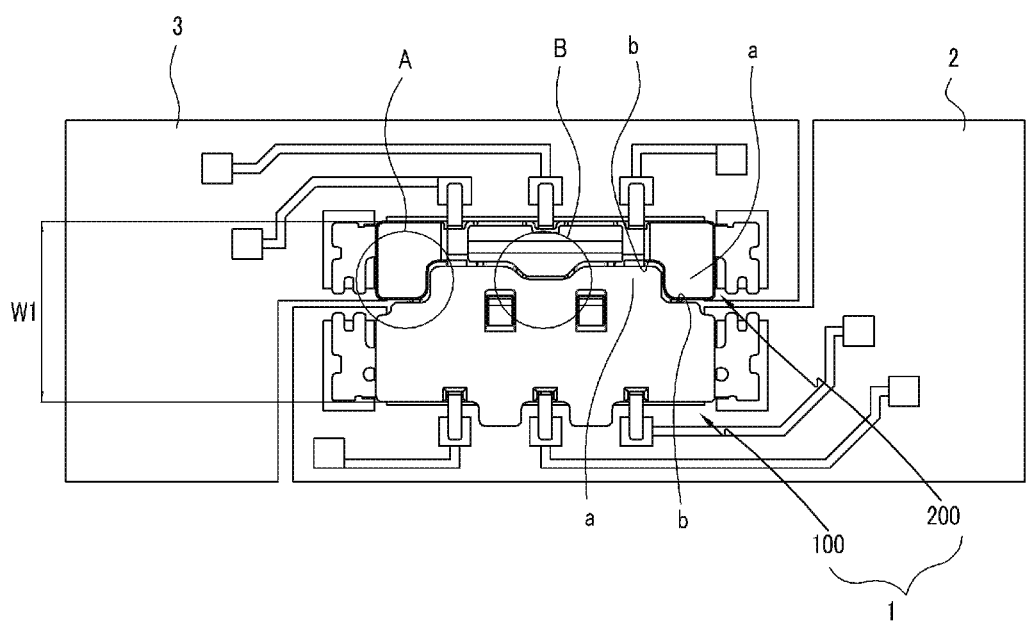
FIG. 2 is a top view of FIG. 1.
Figure 3:
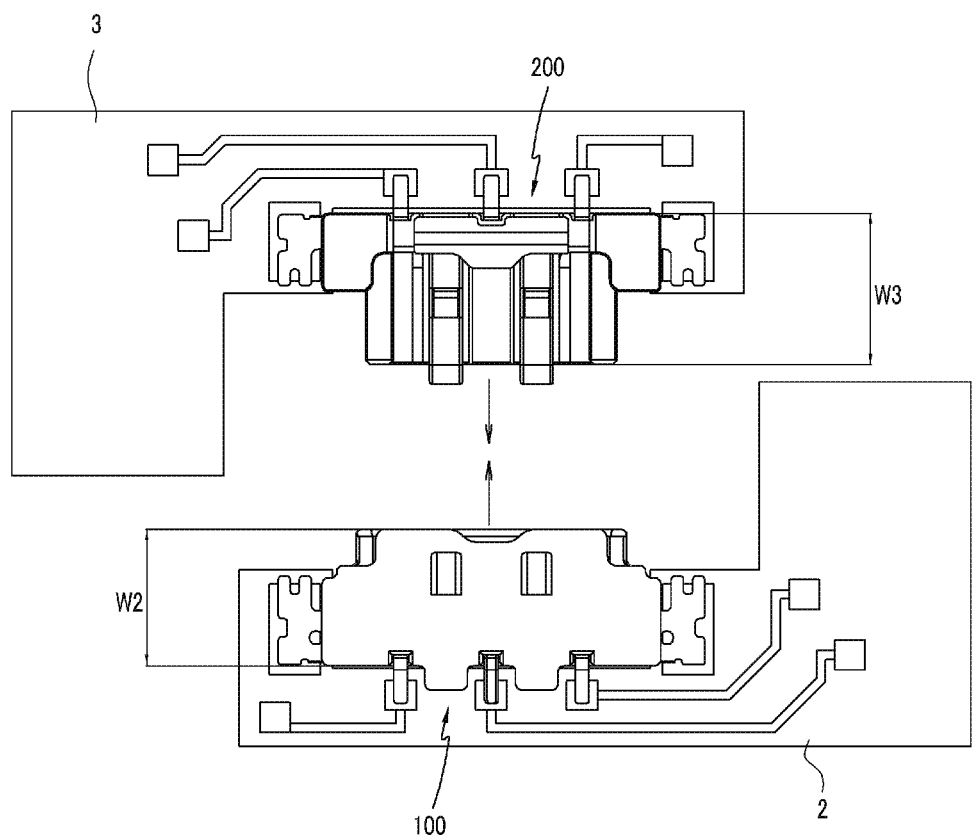
FIG. 3 is a top view of two PCBs being connected.

FIGS. 1-3 illustrate a board-to-board connector assembly according to the Present Disclosure. Referring to the Figures, the first and second PCBs 2, 3 connected by the board-to-board connector assembly 1 of the Present Disclosure are formed in an elongated bar shape, and the connecting parts are formed in a respectively incised form, while the incised parts interconnect with one another to make the connection. The connecting portions of the two PCBs 2, 3 are each formed in the cross direction that is narrower in width, so that the two PCBs 2, 3 overlap and interconnect with one another in the cross direction (side direction) that is shorter in length. The left-right width (cross-directional width) of the two PCBs 2, 3 having interconnecting parts matches the width of the individual PCBs 2, 3. By this way of coupling the PCBs 2, 3, miniaturization, i.e., compact size, can be achieved in products that adopt the connector according to the Present Disclosure.

The board-to-board connector assembly 1 of the Present Disclosure is mounted to each connecting part of the PCBs 2, 3, configured as a receptacle connector 100 and a plug connector 200 that couple removably together. Each connector 100, 200 is mounted so as to face the lateral direction from the connecting parts of the two PCBs 2, 3.

In addition, in order to realize the compact size of the product, when the receptacle connector 100 and plug connector 200 are coupled together, the coupled portion does not have a box-type shape but a mutually interconnecting shape. In other words, as in the A and B portions of FIG. 2, the front end part of the receptacle connector 100 (with respect to the coupling direction) and the plug connector 200 are assembled interconnecting with each other. To this end, on the front end part of the receptacle connector 100 and on the plug connector 200 are formed a projecting part a and a recessed part b, connected with one another, and when the two connectors 100, 200 are fastened together, are assembled by inserting the projecting part a into the recessed part b. By means of this coupling structure, the front-back thickness W1 when the two connectors 100, 200 are coupled together is smaller than the sum of the front-back thickness W2 of the receptacle connector 100 and the front-back thickness W3 of the plug connector (that is, W1<W2+W3), and the front-back thickness of products that adopt the connector according to the Present Disclosure can be reduced. By virtue of being assembled so that the projecting part a is inserted into the recessed part b, the coupling of the two connectors 100, 200 can be kept secure even when the PCB and product are twisted, and the contact status between the terminals furnished on the two connectors 100, 200 can be kept secure.

Figure 4:
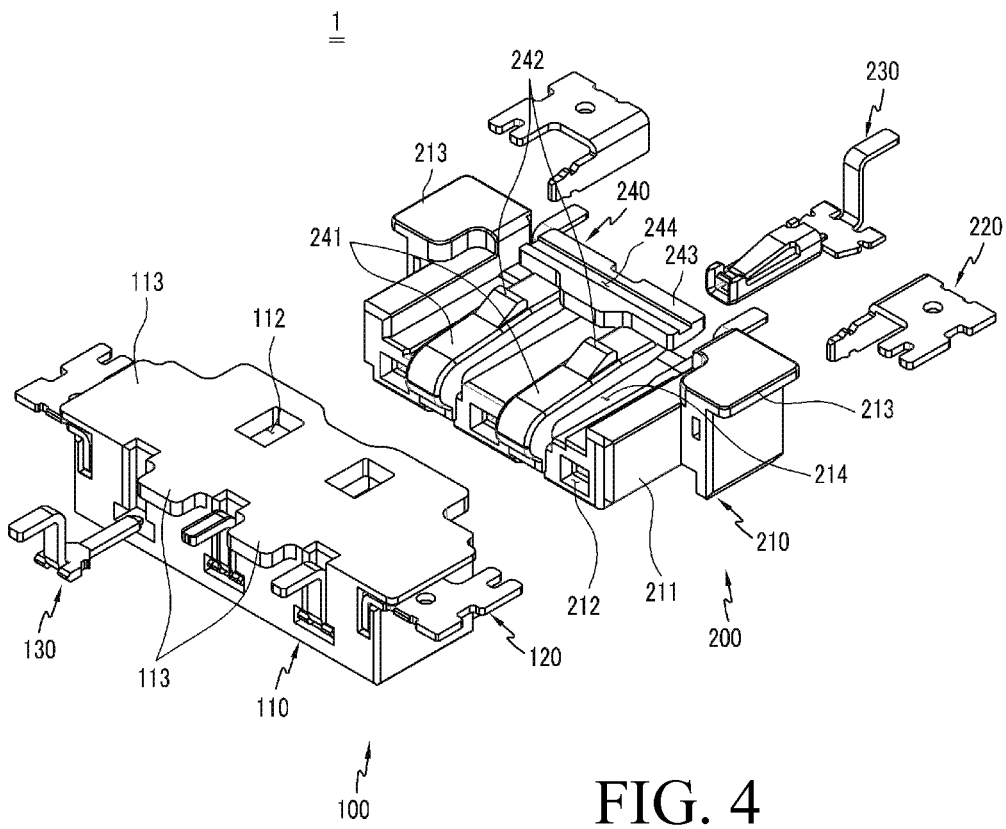
FIG. 4 is an exploded perspective view of the connector assembly of FIG. 1.
Figure 5:
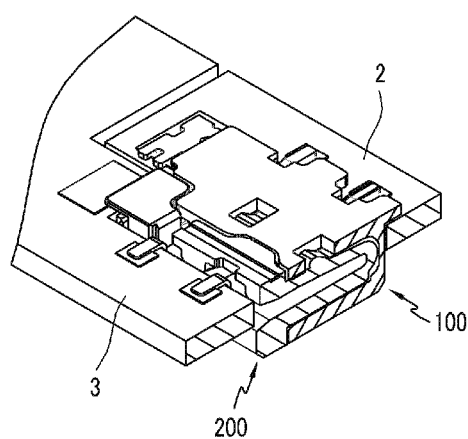
FIG. 5 is a partial perspective view of two PCBs connected by the connector assembly of FIG. 1.
Figure 6:
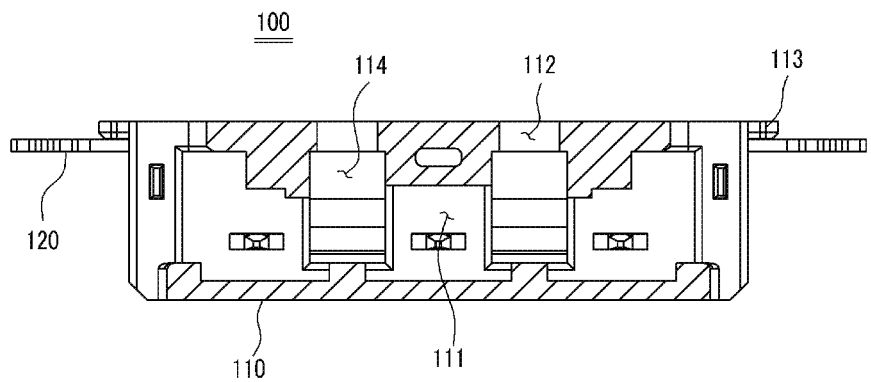
FIG. 6 is a front view of a receptacle connector according to the Present Disclosure.
Figure 7:
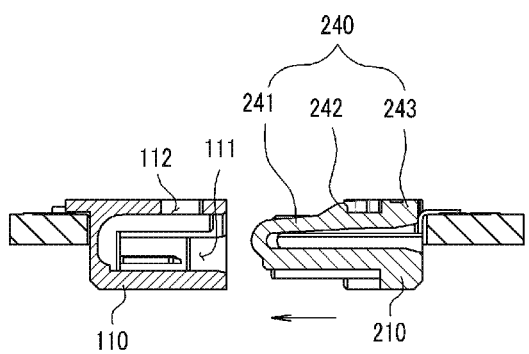
FIGS. 7-9 are cross-sections depicting the working relationship of the locking part in the process of coupling the receptacle connector and a plug connector.

Referring to FIGS. 4-5, the board-to-board connector assembly 1 of the Present Disclosure includes a receptacle connector 100 and a plug connector 200 coupled removably by sliding together. By forming the receptacle connector 100 and plug connector 200 as an off-set type installed passing through each PCB 2, 3, the height of the product can be reduced. In other words, a low-profile product can be achieved.

The receptacle connector 100 comprises a receptacle header 110, receptacle fitting nail 120 and receptacle contact terminal 130. In the receptacle header 110, the plug insertion space 111 into which the below-described fastening part 211, which makes up the plug header 210 of the plug connector 200, is inserted, is formed open toward the front, with respect to the coupling direction. On top of the receptacle header 110, two locking holes 112 are formed to the left and right, into which the locking projections 242 of the below-described push lever 241 are inserted. Wing parts 113 are formed on the rear part and either side of the receptacle header 110, so that during installation the receptacle header 110 catches on the top surface of the first PCB 2 so as not to slip out toward the back.

The receptacle fitting nails 120 are intended to fix the receptacle header 110 to the first PCB 2; they have a bending structure, and the bottom part thereof is inserted into either side of the receptacle header 110, while the soldering part of the upper part thereof is located on either side of the receptacle header 110, so as to be soldered to the top surface of the first PCB 2. The receptacle contact terminal 130 is fixed by insertion into the receptacle header 110 via the rear part of the receptacle header 110. Such a receptacle contact terminal 130 has a bending structure; the lower contact part thereof is formed in a plate shape and positioned within the plug insertion space 111 of the receptacle header 110; the upper soldering part is positioned behind the receptacle header 110 and soldered to the top of the first PCB 2.

The plug connector 200 comprises a plug header 210, plug fitting nail 220, plug contact terminal 230 and locking part 240. With respect to the coupling direction, a fastening part 211 is formed on either side of the plug header 210, and can be inserted removably into the plug insertion space 111 of the receptacle header 110; when coupling, the vicinity of the fastening part 211 contacts the front part of the plug header 210 in an interconnecting fashion. Inside the plug header 210, contact terminal insertion holes 212 are formed spaced apart to left and right, into which a plurality of plug contact terminals 230 are inserted via the bottom surface. Wing parts 213 are formed respectively on either side of the top of the receptacle header 210, so that during installation it catches on the top surface of the second PCB 3, so as not to slip out toward the back.

The plug fitting nail 220 is intended to fix the plug header 210 to the second PCB 3; it has a bending structure, and the bottom part thereof is inserted and fixed to either end of the plug header 210, while the top soldering part thereof is positioned on either side of the plug header 210 and soldered to the top of the second PCB 3. The plug contact terminal 230 is inserted and fixed within the contact terminal insertion hole 212 of the plug header 210, via the bottom face of the plug header 210. The receptacle contact terminal 230 has a bending structure; the lower contact part thereof is formed in a plate shape and positioned within the contact terminal insertion hole 212 of the plug header 210; the upper soldering part is positioned behind the plug header 210 and soldered to the top of the second PCB 3.

The locking part 240 is formed as a single unit with the fastening part 211 of the plug header 210; the fastening part 211 of the plug header 210 is locked to or unlocked from the plug insertion space 111 of the receptacle header 110. The locking part 240 comprises a pair of push levers 241 that operate elastically up and down and extent backward, spaced apart from the top surface of the fastening part 211, starting from the front end of the top surface of the fastening part 211; locking projections 242 that project upward from the top surface of the push lever 241 to fit into the locking hole 112 of the receptacle header 110; and a pressing part 243 designed to be pressed when releasing the locking part 240, which is connected with the rear end of the two push levers 241. On the top surface of the pressing part 243, a pressing groove 244 is formed whereinto a tool or fingernail is inserted so that it can be securely depressed using the tool or fingernail. On the top of the plug header 210 that includes the fastening part 211, a groove-shaped operating space 214 is furnished wherein the push lever 241 can be operated. The operating space 214 is furnished in a location that passes through the second PCB 3, and therefore the push lever 241 is operated in a way that passes through the second PCB 3. By means of such an operating structure of the push lever 241, the height of the product is reduced to realize a low profile.

On the top surface within the plug insertion space 111 of the receptacle header 110, lever insertion grooves 114 are formed spaced apart to left and right, into which, when the fastening part 211 is inserted into the plug insertion space, the push lever 241 is inserted while sliding in a way that prevents slippage to left or right, due to the structure in which the push lever 241 is slid into the lever insertion groove 114, the fastening part 2111 can be securely inserted by sliding into the plug insertion space 111. Accordingly, a pair of push levers 241 and locking projections 242 are furnished on the fastening part 211, so that when the two connectors are fastening together a click sensation can be provided, and the terminals can be kept securely in contact by preventing left-right slippage of the two connectors.

Referring to FIGS. 7-11, the contact part of the plug contact terminal 230 consists of a first contact part 231 that seats and contacts the contact part of the receptacle contact terminal 130; and a second contact part 232 that is located above the first contact part 231 and extends forward from the rear end of the first contact part 231, and is elastic so that when the contact part of the receptacle contact terminal 130 is pressed down from above, it is brought firmly into contact with the first contact terminal 231. The receptacle contact terminal 130, by virtue of having a dual contact structure in which the top and bottom surfaces are both contacted to the plug contact terminal 230, enables a secure contact and also enables a low profile to be realized.

Figure 8:
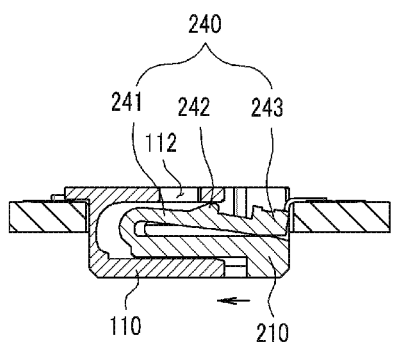
Figure 9:
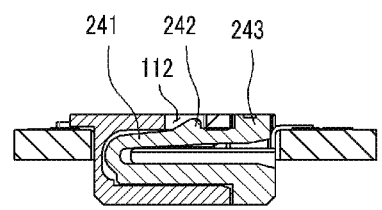
Figure 10:
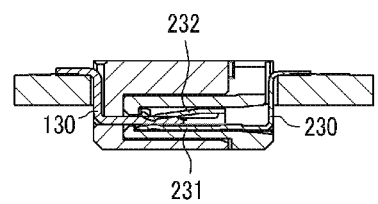
FIG. 10 is a cross-section showing the contact between the two contact terminals in the state depicted in FIG. 9.
Figure 11:
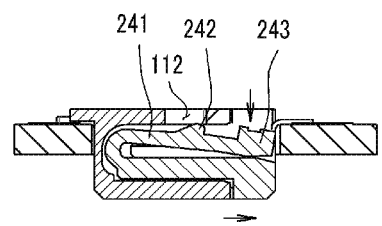
FIG. 11 is a cross-section showing the operating relationship of the locking part when the locking between the receptacle connector and the plug connector is released.

In the process of insertion of the fastening part 211 of the plug header 210 into the plug insertion space 111, as shown in FIG. 8, the push lever 241 is pressed and caused to descend, and when the locking projection 242 reaches the position of the locking hole 112, it is raised by its own elasticity, so that as shown in FIG. 9, locking occurs by the locking projection 242 being pushed automatically into the locking hole 112. To separate the receptacle connector 100 and plug connector 200, as shown in FIG. 11, the pushing part 243 of the push lever 241 is pushed downward to separate the locking projection 242 from the locking hole 112, so that the two connectors 100, 200 can easily be unlocked. As described above, when unlocking, the push lever 241 is operated in a way that passes through the second PCB 3.

Figure 12:
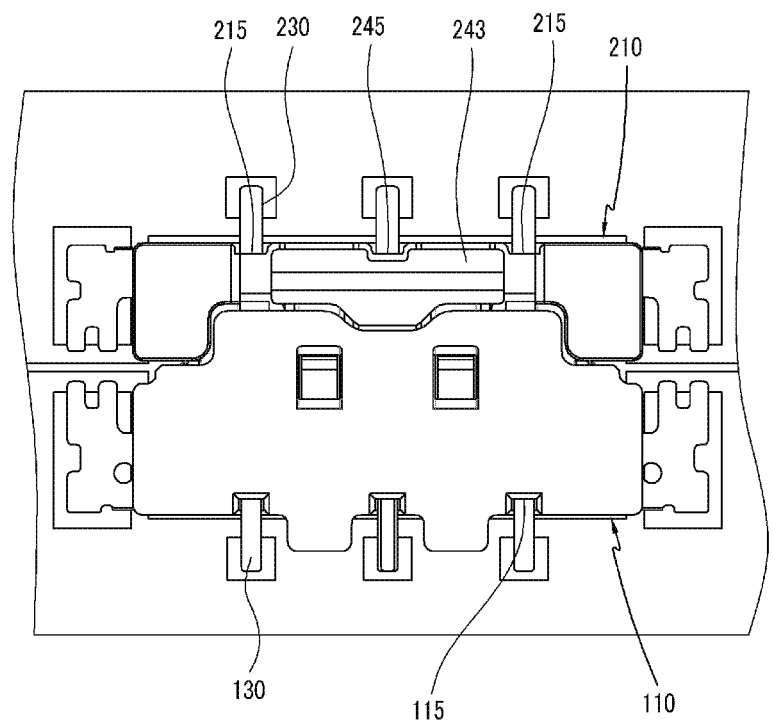
FIG. 12 shows the state in which the receptacle terminal and the curved part of the plug terminal are inserted into the rear part of the receptacle head and the rear part of the plug header.

Referring to FIG. 12, a plurality of bending part insertion grooves 115, 215 are formed on the rear part of the receptacle header 110 and on the plug header 210, into which the upward-curved parts of the respective contact terminals 130, 230 are respectively inserted, so that a compact size can be achieved by reducing the front-back thickness of the product. The curved part of the plug contact terminal 230, located in the center of the plug header 210 in the plug contact terminal 230, is inserted both into the plug header 210 and the rear part of the locking part 240; to this end, a bending part insertion groove 245 is also formed on the rear part of the pushing part 243 that makes up the locking part 240. Because the space occupied by the two connectors 100, 200 is compressed by means of this coupling structure of the contact terminals 130, 230, a compact product size can be achieved.

While a preferred embodiment of the Present Disclosure is shown and described, it is envisioned that those skilled in the art may devise various modifications without departing from the spirit and scope of the foregoing Description and the appended Claims.

What is claimed is:

1. A board-to-board connector assembly configured to electrically connect a first printed circuit board (PCB) to a second PCB, the board-to-board connector assembly comprising:

a receptacle connector having a receptacle header and at least one receptacle contact terminal, the receptacle header defining at least one insertion space, the at least one insertion space being open to a front end of the receptacle header, the at least one receptacle contact terminal being secured to the receptacle header, the at least one receptacle contact terminal having a contact part and a soldering part, the contact part of the at least one receptacle contact terminal being positioned within the at least one insertion space, wherein the front end of the receptacle header is positioned further forward than the contact part of the at least one receptacle contact terminal, a lower surface of the soldering part of the at least one receptacle contact terminal being configured to be mounted and electrically connected to a top surface of the first PCB;

a plug connector having a plug header and at least one plug contact terminal, the plug header having a fastening part and a locking part, the fastening part defining at least one insertion hole, the at least one insertion hole being open to a front end of the plug header, the at least one plug contact terminal being secured to the plug header, the locking part being configured to operate elastically in a vertical direction, the at least one plug contact terminal having a contact part and a soldering part, the contact part of the at least one plug contact terminal being positioned within the at least one insertion hole, wherein the front end of the plug header is positioned further forward than the contact part of the at least one plug contact terminal, a lower surface of the soldering part of the at least one plug contact terminal being configured to be mounted and electrically connected to a top surface of the second PCB, wherein the at least one receptacle contact terminal has a bending structure such that the contact part of the at least one receptacle contact terminal is entirely positioned lower than the lower surface of the soldering part of the at least one receptacle contact terminal, and wherein the at least one plug contact terminal has a bending structure such that the contact part of the at least one plug contact terminal is entirely positioned lower than the lower surface of the soldering part of the at least one plug contact terminal, wherein, when the plug connector is secured to the receptacle connector, the fastening part of the plug connector is inserted into the at least one insertion space of the receptacle connector, whereby the contact part of the at least one receptacle contact terminal enters into the at least one insertion hole and electrically contacts the contact part of the at least one plug contact terminal and the locking part locks the fastening part to the receptacle header.

2. The board-to-board connector assembly of claim 1, wherein the locking part includes a push lever, the push lever operating elastically in the vertical direction and extending rearward, spaced apart from a top surface of the fastening part, and starting from a front end of the top surface of the fastening part.

3. The board-to-board connector assembly of claim 2, wherein the locking part further includes a locking projection, the locking projection removably fastened into a locking groove formed on the receptacle header, the locking projection projecting forward from the push lever.

4. The board-to-board connector assembly of claim 2, wherein the push lever is formed as a pair of spaced apart left and right push levers, the push levers being connected together at a rearward end thereof by a pushing part.

5. The board-to-board connector assembly of claim 2, wherein a lever insertion groove is formed on an inside top surface of the at least one insertion space where the push lever is inserted by sliding, to prevent deviation to left or right, so that the fastening part can be inserted securely into the at least one insertion space by sliding.

6. The board-to-board connector assembly according to claim 1, wherein the front end of the receptacle header has a projecting part and a recessed part, and wherein a front end of the fastening part of the plug header has a projecting part and a recessed part, and wherein, when the fastening part is inserted into the at least one insertion space, the projecting part of the receptacle header is complementary to the recessed part of the fastening part and the projecting part of the fastening part is complementary to the recessed part of the receptacle header.

7. The board-to-board connector assembly of claim 1, further comprising a receptacle fitting nail, the receptacle fitting nail having a bending structure defining upper and lower parts thereof, the lower part being fixed to the receptacle header and the upper part being soldered to a top surface of the first PCB.

8. The board-to-board connector assembly of claim 1, further comprising a plug fitting nail, the plug fitting nail having a bending structure defining upper and lower parts thereof, the lower part being fixed to the plug header and the upper part being soldered to a top surface of the second PCB.

9. The board-to-board connector assembly of claim 1, wherein the soldering part of the at least one receptacle contact terminal is positioned behind the receptacle header.

10. The board-to-board connector assembly of claim 1, wherein at least one bending-part insertion groove is formed on a rearward part of the receptacle header, and wherein a portion of the at least one receptacle contact terminal is inserted into the at least one bending-part insertion groove.

11. The board-to-board connector assembly of claim 1, wherein the at least one receptacle contact terminal and the at least one plug contact terminal have a dual contact structure.

12. The board-to-board connector assembly of claim 1, wherein the soldering part of the at least one plug contact terminal is located on a rear end of the plug header.

13. The board-to-board connector assembly of claim 1, wherein at least one bending-part insertion groove is formed on a rearward part of the plug header, and wherein a portion of the at least one plug contact terminal is inserted into the at least one bending-part insertion groove.

14. The board-to-board connector assembly of claim 13, wherein the bending-part insertion groove is also formed on a rear part of the locking part.

* * * * *